US010270363B2

(12) United States Patent
Shimizu

(10) Patent No.: US 10,270,363 B2
(45) Date of Patent: Apr. 23, 2019

(54) CMOS INVERTER CIRCUIT THAT SUPPRESSES LEAKAGE CURRENTS

(71) Applicant: Synaptics Japan GK, Tokyo (JP)

(72) Inventor: Naoji Shimizu, Tokyo (JP)

(73) Assignee: Synaptics Japan GK, Tokyo (JP)

( * ) Notice: Subject to any disclaimer, the term of this patent is extended or adjusted under 35 U.S.C. 154(b) by 0 days.

(21) Appl. No.: 15/380,744

(22) Filed: Dec. 15, 2016

(65) Prior Publication Data

US 2017/0179848 A1 Jun. 22, 2017

(30) Foreign Application Priority Data

Dec. 17, 2015 (JP) .................................. 2015-246444

(51) Int. Cl.
| H03K 3/00 | (2006.01) |
|---|---|
| H02M 7/537 | (2006.01) |
| H01L 27/06 | (2006.01) |
| H01L 27/092 | (2006.01) |
| H02M 3/07 | (2006.01) |
| H03K 17/16 | (2006.01) |
| H03K 17/284 | (2006.01) |

(52) U.S. Cl.
CPC ........ *H02M 7/537* (2013.01); *H01L 27/0629* (2013.01); *H01L 27/092* (2013.01); *H02M 3/07* (2013.01); *H03K 17/162* (2013.01); *H03K 17/284* (2013.01); *H03K 2217/0036* (2013.01)

(58) Field of Classification Search
CPC ...... H02M 7/537; H02M 3/07; H03K 17/284; H03K 17/162; H03K 2217/0036; H01L 27/092; H01L 27/0629
See application file for complete search history.

(56) References Cited

U.S. PATENT DOCUMENTS 4,369,381 A * 1/1983 Okamoto ............. H03K 3/3565
  327/206
4,563,654 A * 1/1986 Arai ...................... H03F 1/3205
  330/253

(Continued)

FOREIGN PATENT DOCUMENTS

| JP | 2005175540 A | 6/2005 |
|---|---|---|
| JP | 2010178038 A | 8/2010 |
| JP | 2011087036 A | 4/2011 |

*Primary Examiner* — Kenneth B Wells
(74) *Attorney, Agent, or Firm* — Patterson + Sheridan, LLP

(57) ABSTRACT

An inverter circuit includes: a first P-channel MISFET having a source connected to a positive-side terminal and a drain connected to an output terminal; a first N-channel MISFET having a source connected to a negative-side terminal and a drain connected to the output terminal; a first delay element connected between a gate of the first P-channel MISFET and an input terminal to which an input signal is supplied; first switch element connected in parallel with the first delay element between the input terminal and the gate of the first P-channel MISFET; a second delay element connected between the input terminal and a gate of the first N-channel MISFET; and a second switch element connected in parallel with the second delay circuit between the input terminal and the gate of the first N-channel MISFET. The first and second switch elements operate in response to a potential on the output terminal.

20 Claims, 11 Drawing Sheets

(56) References Cited

U.S. PATENT DOCUMENTS

| | | | | | |
|---|---|---|---|---|---|
| 4,617,529 | A | * | 10/1986 | Suzuki | G05F 3/205 |
| | | | | | 331/176 |
| 5,111,076 | A | * | 5/1992 | Tarng | H03K 19/00353 |
| | | | | | 326/27 |
| 5,315,187 | A | * | 5/1994 | Cheng | H03K 19/00361 |
| | | | | | 326/27 |
| 6,111,432 | A | * | 8/2000 | Gerber | H04L 25/029 |
| | | | | | 326/57 |
| 7,659,781 | B2 | * | 2/2010 | Chow | H03F 1/34 |
| | | | | | 330/277 |
| 8,884,653 | B2 | * | 11/2014 | Inoue | H03K 5/2481 |
| | | | | | 327/54 |

* cited by examiner

CMOS INVERTER CIRCUIT THAT SUPPRESSES LEAKAGE CURRENTS

CROSS REFERENCE

This application claims priority of Japanese Patent Application No. 2015-246444, filed on Dec. 17, 2015, the disclosure which is incorporated herein by reference in its entirety.

TECHNICAL FIELD

The present disclosure relates to inverter circuits.

BACKGROUND ART

Power consumption of recent semiconductor integrated circuits tends to be increased due to their high functionalities. For instance, recent display panel drivers suffer from a significant increase in power consumption due to an increase in the number of pixels of display panels. Power consumption reduction is one of the most significant issues of recent integrated circuits.

The through current of the inverter circuit, particularly the CMOS (complementary metal oxide semiconductor) inverter, is known as one cause of the increase in the power consumption of a semiconductor integrated circuit. Discussed below is the through current of a CMOS inverter.

FIG. 1 illustrates the configuration of a typical CMOS inverter, which is denoted by numeral 100. The CMOS inverter 100 includes a PMOS transistor MP1 and an NMOS transistor MN1. The gates of the PMOS transistor MP1 and the NMOS transistor MN1 are commonly connected to an input terminal 101 to which an input signal $V_{IN1}$ is supplied. The drains of the PMOS transistor MP1 and the NMOS transistor MN1 are commonly connected to an output terminal 102 from which an output signal $V_{OUT1}$ is externally output. The source of the PMOS transistor MP1 is connected to a positive-side terminal 103 (for example, a power supply terminal) and the source of the NMOS transistor MN1 is connected to a negative-side terminal 104 (for example, a circuit-ground terminal). In FIG. 1, the legend "$C_{LOAD}$" denotes a load capacitance connected to the output terminal 102 of the CMOS inverter 100.

FIG. 2 is a timing chart illustrating one example of the operation of the CMOS inverter 100 illustrated in FIG. 1. Illustrated in FIG. 2 are the voltage levels of the input signal $V_{IN1}$ and the output signal $V_{OUT1}$, and the current levels $|I_{p1}|$, $|I_{n1}|$ of the currents $I_{p1}$, $I_{n1}$ flowing through the PMOS transistor MP1 and the NMOS transistor MN1. It is assumed that the input signal $V_{IN1}$ is initially set to the low level (the circuit-ground level $V_{SS}$ in the operation illustrated in FIG. 2). In this situation, the PMOS transistor MP1 is placed in the on-state and the NMOS transistor MN1 is placed in the off-state, whereas the output signal $V_{OUT1}$ is set to the high level (the power supply level $V_{DD}$, in the operation illustrated in FIG. 2).

When the input signal $V_{IN1}$ is switched from the low level to the high level, the output signal $V_{OUT1}$ is switched from the high level to the low level, since the PMOS transistor MP1 is turned off and the NMOS transistor MN1 is turned on. In detail, the turn-on of the NMOS transistor MN1 generates a current flow from the load capacitance $C_{LOAD}$ to the negative-side terminal 104 through the NMOS transistor MN1, discharging the charges from the load capacitance $C_{LOAD}$. This allows pulling down the output signal $V_{OUT1}$ to the low level. It should be noted that, in FIG. 2, time $t_1$ denotes the time when the switching of the input signal $V_{IN1}$ from the low level to the high level is started and time $t_2$ denotes the time when the output signal $V_{OUT1}$ is set to the low level. The output signal $V_{OUT1}$ is set to the low level at time $t_2$, which is the time when the falling time $t_{F1}$ has elapsed since time $t_1$.

Between time $t_1$ and time $t_2$, there is a period during which both of the PMOS transistor MP1 and the NMOS transistor MN1 are turned on, and this causes a current flow through both of the PMOS transistor MP1 and the NMOS transistor MN1 during this period. In other words, a through current undesirably flows during the period between time $t_1$ and time $t_2$, during which the output signal $V_{OUT1}$ is being switched from the high level to the low level.

The same applies to the case when the input signal $V_{IN1}$ is switched from the high level to the low level. After the switching of the input signal $V_{IN1}$ from the high level to the low level is started at time $t_3$, the output signal $V_{OUT1}$ is pulled up to the high level at time $t_4$, which is the time when the rising time $t_{R1}$ has elapsed since time $t_3$. Between the time $t_3$ and the time $t_4$, there is a period during which both of the PMOS transistor MP1 and the NMOS transistor MN1 are turned on and this causes a current flow through both of the PMOS transistor MP1 and the NMOS transistor MN1 during this period. In other words, a through current undesirably flows during the period between time $t_3$ and time $t_4$, during which the output signal $V_{OUT1}$ is being switched from the low level to the high level.

Various techniques have been proposed to reduce the through current. For instance, Japanese Patent Application Publications No. 2005-175540 A and 2010-178038 A disclose a technique for reducing the through current by controlling the timing of the turn-on-and-off of the NMOS and PMOS transistors of a CMOS inverter by using delay elements (or delay circuits). Japanese Patent Application Publication No. 2011-87036 A discloses an output buffer circuit including a detection circuit configured to detect the voltage on the common node from which the output signal is output and control the turn-on-and-off of the transistors of the CMOS inverter in response to the detected voltage.

However, there is room for improvement in these known techniques for reduction of the current reduction.

SUMMARY

Accordingly, an objective of the present disclosure is to provide a technique for reducing the through current of an inverter circuit. Other objectives and new features of the present disclosure will be understood to a person skilled in the art from the following disclosure.

In one embodiment, an inverter circuit includes: a first P-channel MISFET having a source connected to a positive-side terminal and a drain connected to an output terminal; a first N-channel MISFET having a source connected to a negative-side terminal and a drain connected to the output terminal, the negative-side terminal having a potential lower than that of the positive-side terminal; a first delay element connected between a gate of the first P-channel MISFET and an input terminal to which an input signal is supplied; a first switch element connected in parallel with the first delay element between the input terminal and the gate of the first P-channel MISFET; a second delay element connected between the input terminal and a gate of the first N-channel MISFET; and a second switch element connected in parallel with the second delay circuit between the input terminal and the gate of the first N-channel MISFET. The first and second switch elements operate in response to a potential on the output terminal.

In another embodiment, an inverter circuit includes: a first P-channel MISFET having a source connected to a positive-side terminal and a drain connected to an output terminal; a first N-channel MISFET having a source connected to a negative-side terminal and a drain connected to the output terminal, the negative-side terminal having a potential lower than that of the positive-side terminal; a first resistor element connected between an input terminal to which an input signal is supplied and a gate of the first P-channel MISFET; a second resistor element connected between the input terminal and a gate of the first N-channel MISFET; a second N-channel MISFET; and a second P-channel MISFET. One of a source and drain of the second N-channel MISFET is connected to the input terminal and the other is connected to the gate of the first P-channel MISFET. One of a source and drain of the second P-channel MISFET is connected to the input terminal and the other is connected to the gate of the first N-channel MISFET. The gates of the second N-channel MISFET and the second P-channel MISFET are connected to the output terminal.

The present disclosure provides a technique for reducing the through current of an inverter circuit.

BRIEF DESCRIPTION OF THE DRAWINGS

The above and other advantages and features of the present disclosure will be more apparent from the following description taken in conjunction with the accompanied drawings, in which.

DESCRIPTION OF PREFERRED EMBODIMENTS

Figure 1:
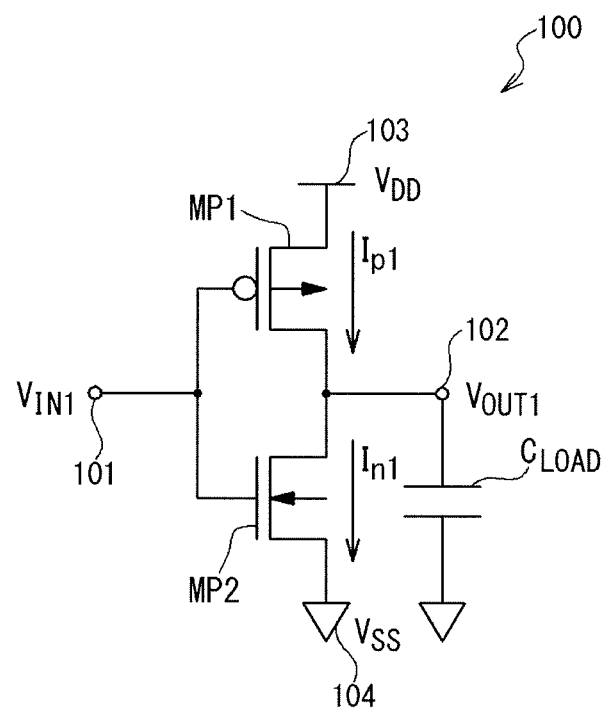
FIG. 1 is a circuit diagram illustrating the configuration of a typical CMOS inverter.
Figure 2:
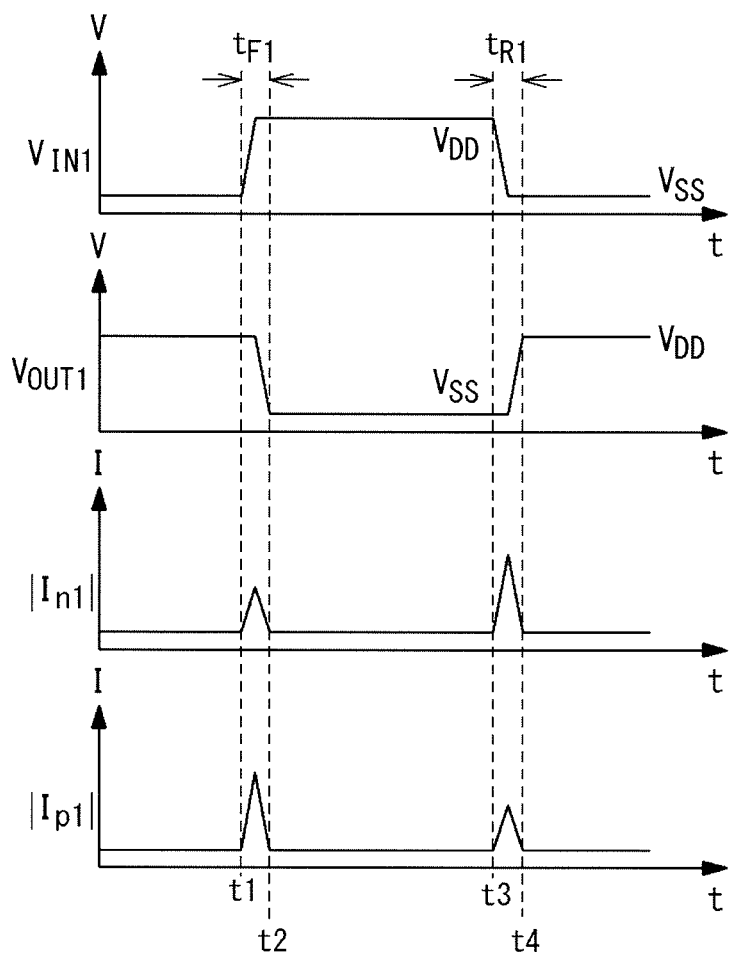
FIG. 2 is a timing chart illustrating an example of the operation of the CMOS inverter.

In the following, various embodiments are disclosed with reference to the attached drawings. It should be noted that the same, similar or corresponding elements may be denoted by the same or similar reference numerals in the attached drawings.

Figure 3:
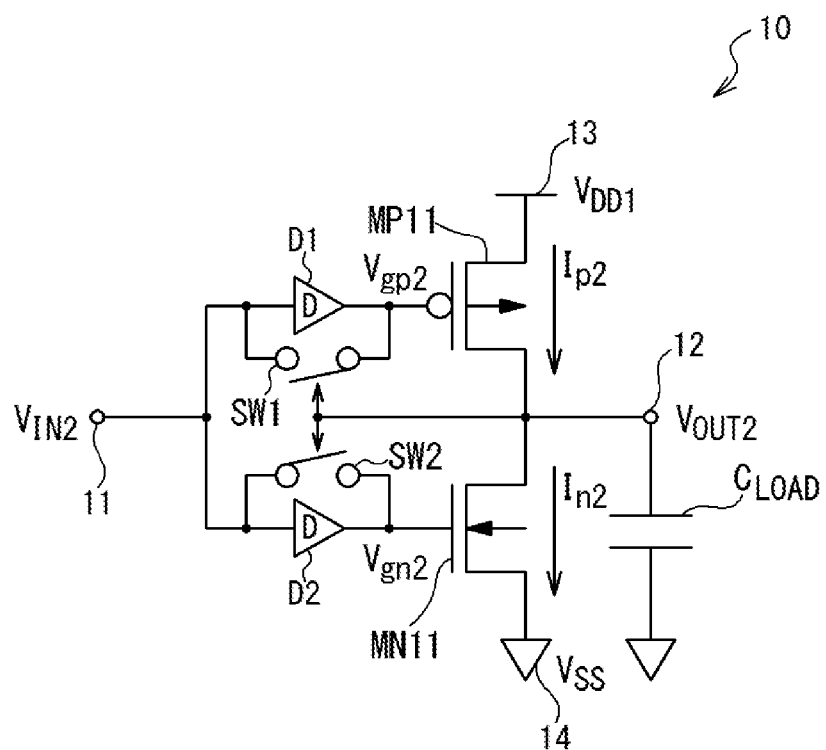
FIG. 3 is a circuit diagram illustrating an exemplary configuration of an inverter circuit in one embodiment.

FIG. 3 is a circuit diagram illustrating the configuration of an inverter circuit 10 according to one embodiment. The inverter circuit 10 is configured to output an output signal $V_{OUT2}$ from an output terminal 12 in response to an input signal $V_{IN2}$ supplied to an input terminal 11. The inverter circuit 10 includes a PMOS transistor MP11, an NMOS transistor MN11, delay elements D1, D2, and switch elements SW1 and SW2. In FIG. 3, the legend "$C_{LOAD}$" denotes a load capacitance connected to the output terminal 12 of the inverter circuit 10. As is well known in the art, the PMOS transistor is a sort of a P-channel MISFET (metal insulator semiconductor field effect transistor) and the NMOS transistor is a sort of an N-channel MISFET.

The PMOS transistor MP11 has a drain connected to the output terminal 12 and a source connected to a positive-side terminal 13 (for example, a power supply terminal). In this embodiment, the positive-side terminal 13 is fixed to the power supply level $V_{DD1}$. The NMOS transistor MN11 has a drain connected to the output terminal 12 and a source connected to a negative-side terminal 14 (for example, a circuit-ground terminal.) In this embodiment, the negative-side terminal 14 is fixed to the circuit-ground level $V_{SS}$.

A delay element D1 and a switch element SW1 are connected in parallel between the input terminal 11 and the gate of the PMOS transistor MP11, and a delay element D2 and a switch element SW2 are connected in parallel between the input terminal 11 and the gate of the NMOS transistor MN11. The delay elements D1 and D2 are configured to delay the input signal $V_{IN2}$ and output the delayed input signal $V_{IN2}$. The delay elements D1 and D2 may each consist of a single circuit element, or include two or more circuit elements. Similarly, the switch elements SW1 and SW2 may each consist of a single circuit element, or include two or more circuit elements.

The switch elements SW1 and SW2 both operate in response to the potential on the output terminal 12. In this embodiment, the switch elements SW1 and SW2 operate so that one of the switch elements SW1 and SW2 is turned on when the other is turned off. In detail, the switch element SW1 is configured so that the switch element SW1 is turned on when the output terminal 12 is set to the high level (the power supply level $V_{DD1}$ in this embodiment) and turned off when the output terminal 12 is set to the low level (the circuit-ground level $V_{SS}$ in this embodiment.) The switch element SW2 is, on the other hand, configured so that the switch element SW2 is turned off when the output terminal 12 is set to the high level and turned on when the output terminal 12 is set to the low level.

Figure 4:
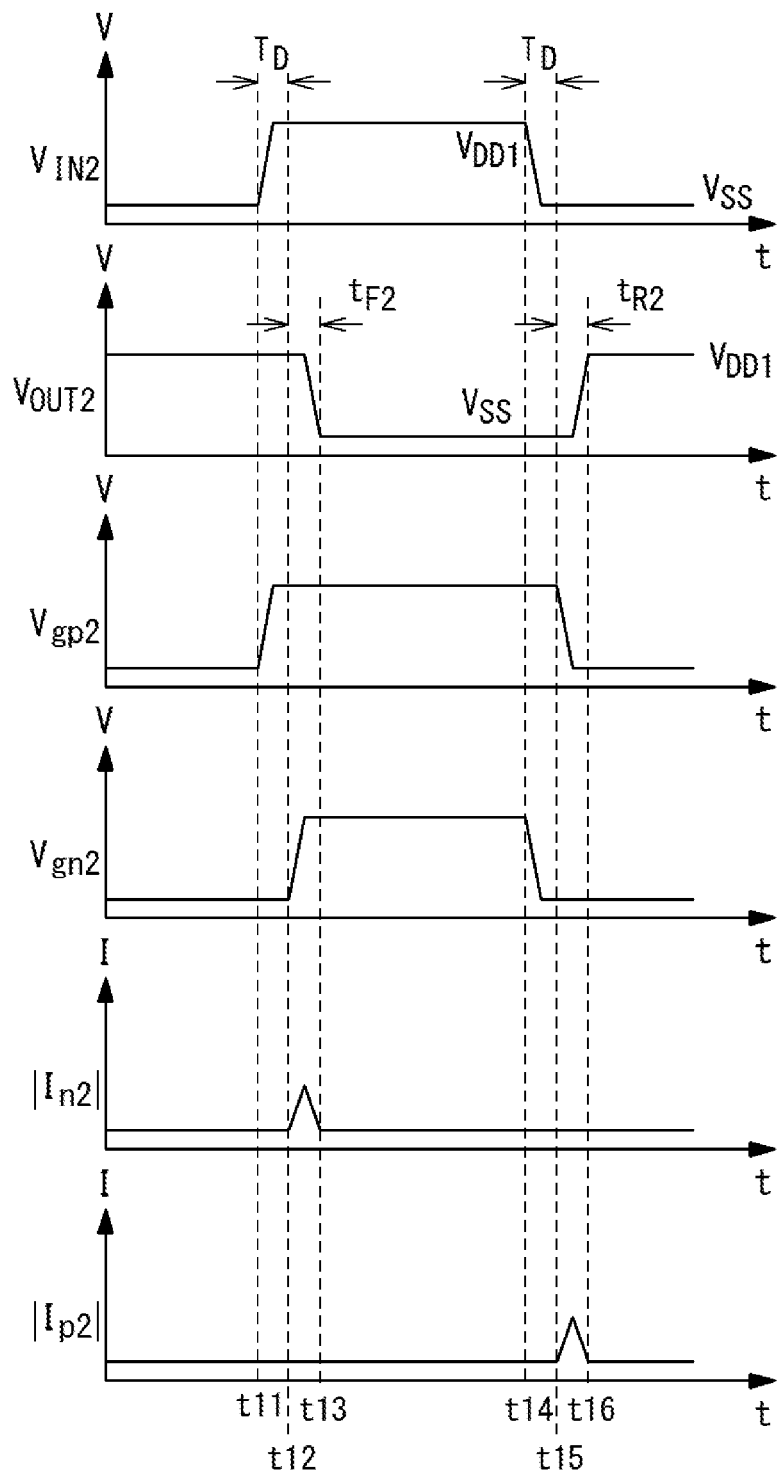
FIG. 4 is a timing chart illustrating an example of the operation of the inverter circuit illustrated in FIG. 3.

The inverter circuit 10 thus configured can effectively reduce the through current with simple circuit configuration. FIG. 4 is a timing chart illustrating an exemplary operation of the inverter circuit 10 in this embodiment. Illustrated in FIG. 4 are the voltage levels of the input signal $V_{IN2}$ and the output signal $V_{OUT2}$, the gate potential $V_{gp2}$ of the PMOS transistor MP11, the gate potential $V_{gn2}$ of the NMOS transistor MN11 and the current levels $|I_{p2}|$ and $|I_{n2}|$ of the currents $I_{p2}$ and $I_{n2}$ which flow through the PMOS transistor MP11 and the NMOS transistor MN11, respectively. In FIG. 4, the operation of the inverter circuit 10 is illustrated with an assumption that the delay times of the delay elements D1 and D2 are both $T_D$.

In the following description, it is assumed that the input signal $V_{IN2}$ is initially set to the low level (the circuit-ground level $V_{SS}$). In this case, the output signal $V_{OUT2}$ is initially set to the high level (the power supply level VDD), since the PMOS transistor MP11 is turned on and the NMOS transistor MN11 is turned off.

When the output signal $V_{OUT2}$ is set to the high level, the switch element SW1 is turned on and the switch element SW2 is turned off. The turn-on of the switch element SW1 allows forming a path which bypasses the delay element D1 while providing an electrical connection between the input terminal 11 and the gate of the PMOS transistor MP11. The input terminal 11 and the gate of the NMOS transistor MN11 are, on the other hand, electrically connected through the delay element D2, since the switch element SW2 is turned off.

Discussed below is the case when the input signal $V_{IN2}$ is switched from the low level to the high level when the inverter circuit 10 is placed in this state. In FIG. 4, the time when the switching of the input signal $V_{IN2}$ from the low level to the high level is started is denoted by the legend "$t_{11}$".

At time $t_{11}$, the switch element SW1 is turned on, and therefore the input terminal 11 and the gate of the PMOS transistor MP11 are electrically connected with the delay element D1 bypassed. Accordingly, substantially no delay from the input signal $V_{IN2}$ occurs with respect to the gate potential $V_{gp2}$ of the PMOS transistor MP11. The gate potential $V_{gp2}$ of the PMOS transistor MP11 is therefore switched from the low level to the high level substantially at the same time as the input signal $V_{IN2}$ is switched from the low level to the high level.

In contrast, the switch element SW2 is turned off at time $t_{11}$, and therefore the input terminal 11 and the gate of the NMOS transistor MN11 are connected through the delay element D2 at this moment. Accordingly, the gate potential $V_{gn2}$ of the NMOS transistor MN11 starts to be switched from the low level to the high level with a delay of the delay time $T_D$ from the input signal $V_{IN2}$. In FIG. 4, the legend "$t_{12}$" denotes the time when the gate potential $V_{gn2}$ of the NMOS transistor MN11 starts to be switched from the low level to the high level.

When the gate potential $V_{gn2}$ is pulled up to the high level and the NMOS transistor MN11 is thereby turned on, the output signal $V_{OUT2}$ is switched from the high level to the low level. In detail, the turn-on of the NMOS transistor MN11 allows a current to flow from the load capacitance $C_{LOAD}$ to the negative-side terminal 14 through the NMOS transistor MN11 to discharge the charges from the load capacitance $C_{LOAD}$. As a result, the output signal $V_{OUT2}$ is pulled down to the low level. In FIG. 4, the legend "$t_{13}$" denotes the time when the output signal $V_{OUT2}$ is set to the low level.

In this operation, the timing at which the NMOS transistor MN11 is switched from the off-state to the on-state is delayed by the delay time $T_D$ of the delay element D2 from the timing at which the PMOS transistor MP11 is switched from the on-state to the off-state. Accordingly, the time duration during which both of the NMOS transistor MN11 and the PMOS transistor MP11 are turned on is reduced, and this effectively reduces the through current.

In an ideal case, the time duration during which both of the NMOS transistor MN11 and the PMOS transistor MP11 are turned on can be reduced to zero by sufficiently increasing the delay time $T_D$ of the delay element D2. In this case, the through current is reduced substantially to zero. It should be noted however that the effect of the reduction of the through current can be effectively obtained even when the delay time $T_D$ of the delay element D2 is small, because the provision of delay time $T_D$ effectively reduces the time duration during which both of the NMOS transistor MN11 and the PMOS transistor MP11 are turned on. Illustrated in FIG. 4 is the operation in which the delay time $T_D$ of the delay element D2 is longer than the rising time of the gate potential $V_{gp2}$ of the PMOS transistor MP11 and therefore the time duration during which both of the NMOS transistor MN11 and the PMOS transistor MP11 are turned on is reduced to zero.

The same applies to the case when the input signal $V_{IN2}$ is switched from the high level to the low level. In FIG. 4, the legend "$t_{14}$" denotes the time when the input signal $V_{IN2}$ starts to be switched from the high level to the low level.

At time $t_{14}$, the switch element SW2 is turned on and therefore the input terminal 11 and the gate of the NMOS transistor MN11 are electrically connected with the delay element D2 bypassed. Accordingly, substantially no delay from the input signal $V_{IN2}$ occurs with respect to the gate potential $V_{gn2}$ of the NMOS transistor MN11. The gate potential $V_{gn2}$ of the NMOS transistor MN11 is therefore switched from the high level to the low level substantially at the same time as the input signal $V_{IN2}$ is switched from the high level to the low level.

In contrast, the switch element SW1 is turned off at time $t_{14}$ and therefore the input terminal 11 and the gate of the PMOS transistor MP11 are connected through the delay element D1 at this moment. Accordingly, the gate potential $V_{gp2}$ of the PMOS transistor MP11 starts to be switched from the high level to the low level with a delay of the delay time $T_D$ from the input signal $V_{IN2}$. In FIG. 4, the legend "$t_{15}$" denotes the time when the gate potential $V_{gp2}$ of the PMOS transistor MP11 starts to be switched from the high level to the low level.

When the gate potential $V_{gp2}$ is pulled down to the low level and the PMOS transistor MP11 is thereby turned on, the output signal $V_{OUT2}$ is switched from the low level to the high level. In detail, the turn-on of the PMOS transistor MP11 allows a current to flow from the positive-side terminal 13 to the load capacitance $C_{LOAD}$ through the PMOS transistor MP11 to charge the load capacitance $C_{LOAD}$. As a result, the output signal $V_{OUT2}$ is pulled up to the high level. In FIG. 4, the legend "$t_{16}$" denotes the time when the output signal $V_{OUT2}$ is set to the high level.

In this operation, the timing at which the PMOS transistor MP11 is switched from the off-state to the on-state is delayed by the delay time $T_D$ of the delay element D1 from the timing at which the NMOS transistor MN11 is switched from the on-state to the off-state. Accordingly, the time duration during which both of the NMOS transistor MN11 and the PMOS transistor MP11 are turned on is reduced and this effectively reduces the through current.

In an ideal case, the time duration during which both of the NMOS transistor MN11 and the PMOS transistor MP11 are turned on can be reduced to zero by sufficiently increasing the delay time $T_D$ of the delay element D1. In this case, the through current is reduced substantially to zero. It should be noted however that the effect of reducing the through current can be effectively obtained even when the delay time $T_D$ of the delay element D1 is small, because the provision of delay time $T_D$ effectively reduces the time duration during which both of the NMOS transistor MN11 and the PMOS transistor MP11 are turned on. Illustrated in FIG. 4 is the operation in which the delay time $T_D$ of the delay element D1 is longer than the rising time of the gate potential $V_{gn2}$ of the NMOS transistor MN11 and therefore the time duration during which both of the NMOS transistor MN11 and the PMOS transistor MP11 are turned on is reduced to zero.

Described in the following are more specific examples of the inverter circuit 10 according to this embodiment.

Figure 5:
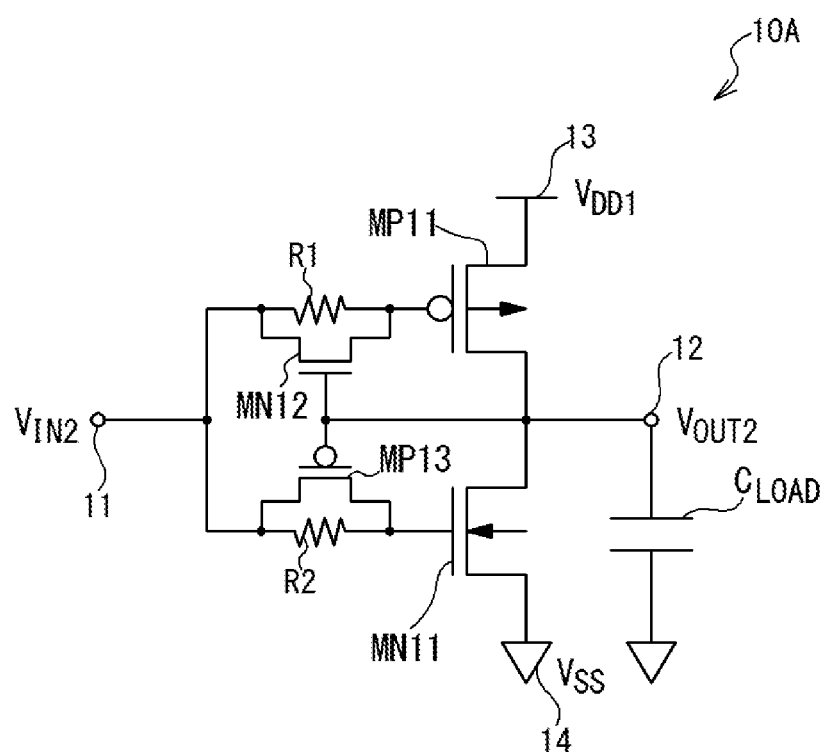
FIG. 5 is a circuit diagram illustrating a more specific example of the inverter circuit according to this embodiment.

FIG. 5 is a circuit diagram illustrating the configuration of an inverter circuit 10A in one practical example. In the circuit configuration illustrated in FIG. 5, resistor elements R1 and R2 are used as the delay elements D1 and D2 in the inverter circuit 10 illustrated in FIG. 3. A polysilicon resistor or a diffusion resistor may be used as the resistor elements R1 and R2. Alternatively, a MOS transistor having a fixed gate potential may be used as the resistor elements R1 and R2 as described later.

Additionally, an NMOS transistor MN12 is used as the switch element SW1 in the inverter circuit 10 illustrated in FIG. 3 and a PMOS transistor MP13 is used as the switch element SW2. One of the source and drain of the NMOS transistor MN12 is connected to the input terminal 11 and the other is connected to the gate of the PMOS transistor MP11. One of the source and drain of the PMOS transistor MP13 is connected to the input terminal 11 and the other is connected to the gate of the NMOS transistor MN11.

The circuit configuration illustrated in FIG. 5 allows implementing the operation illustrated in FIG. 4 to reduce the through current with simple circuit configuration. Additionally, the circuit configuration illustrated in FIG. 5, in which the resistor elements R1 and R2 are used as the delay elements D1 and D2, advantageously reduces the power consumption of the delay elements D1 and D2 themselves. If serially connected inverters are used as the delay elements D1 and D2, for example, this may cause an undesired increase in the power consumption of the delay elements D1 and D2 themselves. The use of the resistor elements R1 and R2, which are passive components, as the delay elements D1 and D2 allows avoiding this problem.

The resistances of the resistor elements R1 and R2 causes an influence on the delays occurring in the resistor elements R1 and R2, that is, the delay times of the gate potentials $V_{gp2}$ and $V_{gn2}$ from the input signal $V_{IN2}$, and accordingly causes an influence on the rising time of the output signal $V_{OUT2}$ (that is, the time duration necessary for switching the output signal $V_{OUT2}$ from the low level to the high level after the input signal $V_{IN2}$ is switched from the high level to the low level) and the falling time of the output signal $V_{OUT2}$ (that is, the time duration necessary for switching the output signal $V_{OUT2}$ from the high level to the low level after the input signal $V_{IN2}$ is switched from the low level to the high level.) When the resistance of the resistor element R1 is increased, for instance, the delay time of the gate potential $V_{gp2}$ of the PMOS transistor MP11 from the input signal $V_{IN2}$ is increased, and therefore the rising time of the output signal $V_{OUT2}$ is increased. Similarly, when the resistance of the resistor element R2 is increased, the delay time of the gate potential $V_{gn2}$ of the NMOS transistor MN11 from the input signal $V_{IN2}$ is increased, and therefore the falling time of the output signal $V_{OUT2}$ is increased.

The rising time and falling time of the output signal $V_{OUT2}$ also depend on the gate capacitances of the PMOS transistor MP11 and the NMOS transistor MN11, respectively. More specifically, the rising time of the output signal $V_{OUT2}$ depends on the falling time of the gate potential $V_{gp2}$ of the PMOS transistor MP11, and the falling time of the gate potential $V_{gp2}$ of the PMOS transistor MP11 depends on the time constant $R_{R1} \cdot C_{GP11}$, where $R_{R1}$ is the resistance of the resistor element R1, and $C_{GP11}$ is the gate capacitance of the PMOS transistor MP11. Similarly, the falling time of the output signal $V_{OUT2}$ depends on the rising time of the gate potential $V_{gn2}$ of the NMOS transistor MN11, and the rising time of the gate potential $V_{gn2}$ of the NMOS transistor MN11 depends on the time constant $R_{R2} \cdot C_{GN11}$, where $R_{R2}$ is the resistance of the resistor element R2, and $C_{GN11}$ is the gate capacitance of the NMOS transistor MN11. If the rising time and the falling time of the output signal $V_{OUT2}$ are largely different from each other, this may cause a difficulty in the circuit design.

To reduce the difference between the rising time and falling time of the output signal $V_{OUT2}$, it would be advantageous if the resistances $R_{R1}$ and $R_{R2}$ of the resistor elements R1 and R2 satisfy the conditions defined as follows:

$$0.8 \le \frac{R_{R1} \cdot C_{GP11}}{R_{R2} \cdot C_{GN11}} \le 1.2 \quad (1)$$

where $C_{GP11}$ and $C_{GN11}$ are the gate capacitances of the PMOS transistor MP11 and the NMOS transistor MN11, respectively.

It would be more advantageous if the resistances $R_{R1}$ and $R_{R2}$ of the resistor elements R1 and R2 satisfy the conditions defined as follows:

$$0.9 \le \frac{R_{R1} \cdot C_{GP11}}{R_{R2} \cdot C_{GN11}} \le 1.1 \quad (2)$$

Figure 6:
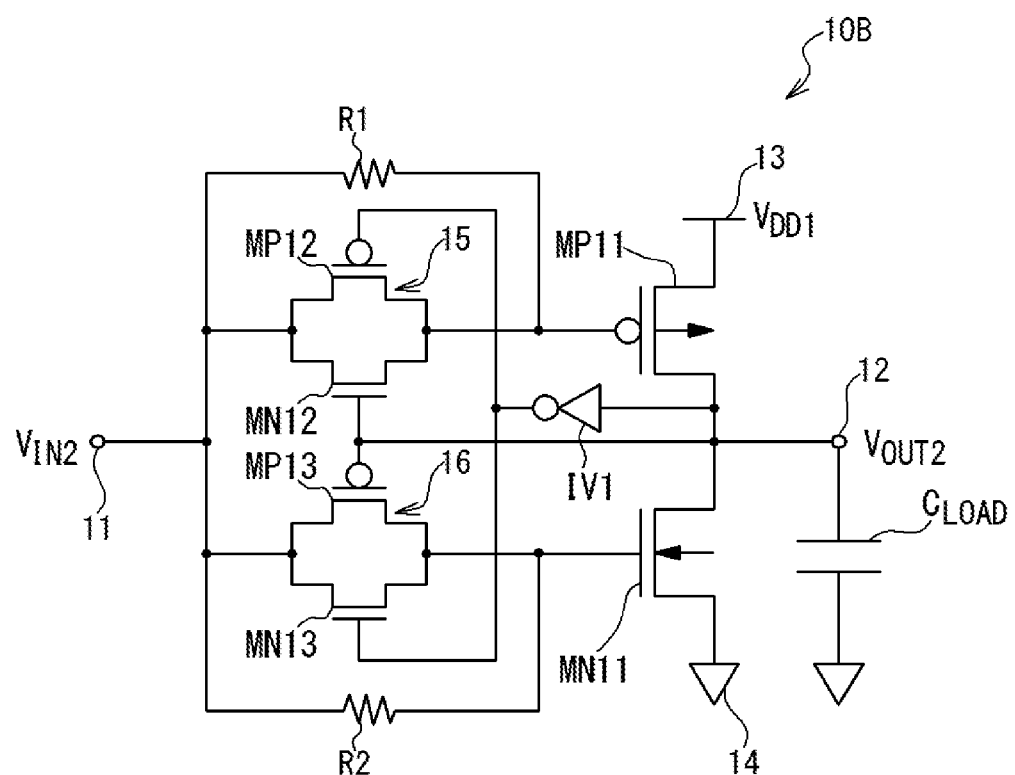
FIG. 6 a circuit diagram illustrating another example of the inverter circuit according to this embodiment.

FIG. 6 is a circuit diagram illustrating the configuration of an inverter circuit 10B in another practical example. In the circuit configuration illustrated in FIG. 6, similarly to the circuit configuration illustrated in FIG. 5, the resistor elements R1 and R2 are used as the delay elements D1 and D2 in the inverter circuit 10 illustrated in FIG. 3.

Additionally, transfer gates 15 and 16 are used as the switch elements SW1 and SW2 in the inverter circuit 10 illustrated in FIG. 3 and an inverter IV1 is additionally provided to operate the transfer gates 15 and 16. The inverter IV1 has an input connected to the output terminal 12 and outputs a signal complementary to the output signal $V_{OUT2}$ output from the output terminal 12.

The transfer gate 15 includes PMOS transistor MP12 and NMOS transistor MN12, which have commonly-connected sources and commonly-connected drains. The commonly-connected sources (or the commonly-connected drains) of the PMOS transistor MP12 and NMOS transistor MN12 are connected to the input terminal 11, and the commonly-connected drains (or the commonly-connected sources) of the PMOS transistor MP12 and NMOS transistor MN12 are connected to the gate of the PMOS transistor MP11. The gate of the PMOS transistor MP12 is connected to the output of the inverter IV1 and the gate of the NMOS transistor MN12 is connected to the output terminal 12.

Similarly, the transfer gate 16 includes PMOS transistor MP13 and NMOS transistor MN13, which have commonly-connected sources and commonly-connected drains. The commonly-connected sources (or the commonly-connected drains) of the PMOS transistor MP13 and NMOS transistor MN13 are connected to the input terminal 11, and the commonly-connected drains (or the commonly-connected sources) of the PMOS transistor MP13 and NMOS transistor MN13 are connected to the gate of the NMOS transistor MN11. The gate of the PMOS transistor MP13 is connected to the output terminal 12 and the gate of the NMOS transistor MN13 is connected to the output of the inverter IV1.

It would be easily understood to a person skilled in the art that the circuit configuration illustrated in FIG. 6 can achieve the operation illustrated in FIG. 4.

Figure 7:
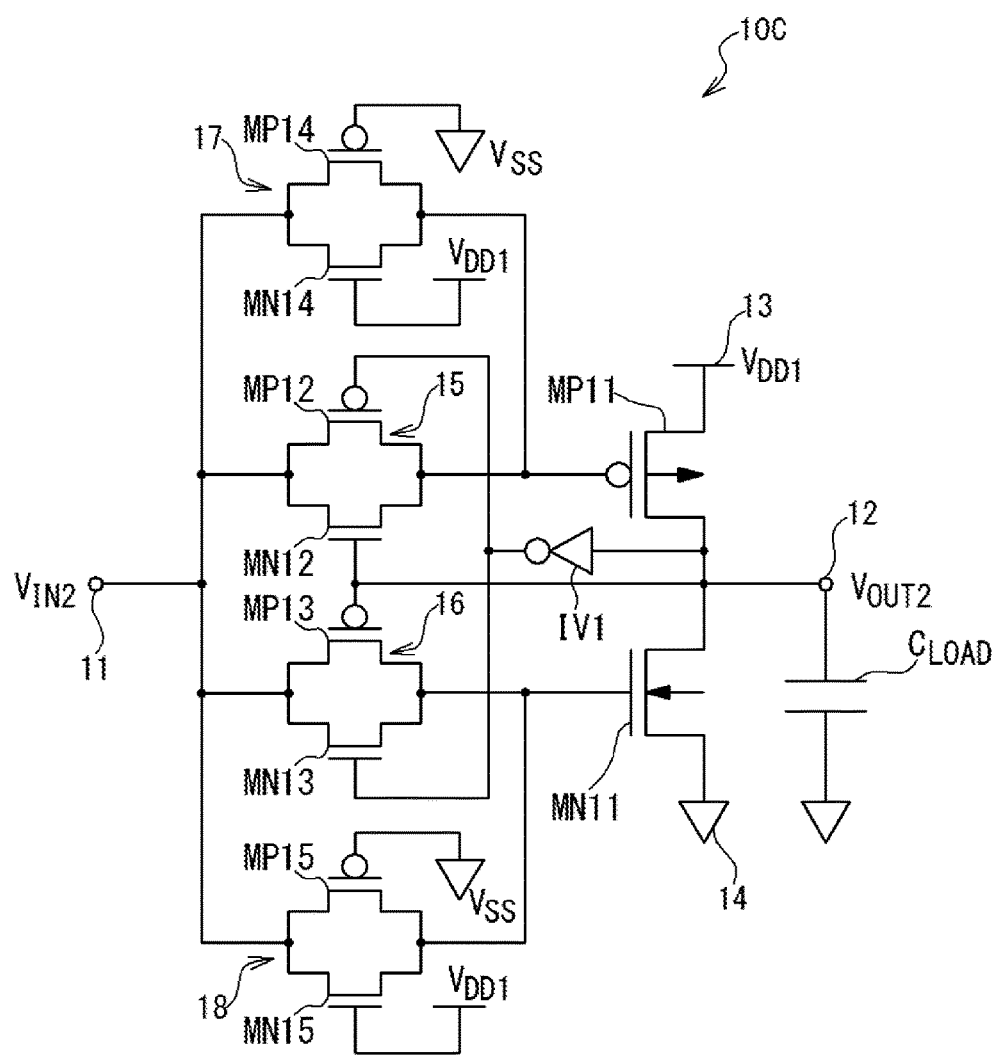
FIG. 7 a circuit diagram illustrating still another example of the inverter circuit according to this embodiment.

FIG. 7 is a circuit diagram illustrating an inverter circuit 10C in still another practical example. In the circuit configuration illustrated in FIG. 7, transfer gates 17 and 18 are used as the delay elements D1 and D2 in the inverter circuit 10 illustrated in FIG. 3, where the transfer gates 17 and 18 each include PMOS and NMOS transistors each having a fixed gate potential.

More specifically, the transfer gate 17 includes a PMOS transistor MP14 and NMOS transistor MN14 which have commonly-connected sources and commonly-connected drains. The commonly-connected sources (or the commonly-connected drains) of the PMOS transistor MP14 and NMOS transistor MN14 are connected to the input terminal 11, and the commonly-connected drains (or the commonly-connected sources) are connected to the gate of the PMOS transistor MP11. The gate of the PMOS transistor MP14 is fixed to the circuit-ground level $V_{SS}$ and the gate of the NMOS transistor MN14 is fixed to the power supply level $V_{DD1}$.

The transfer gate 18 includes a PMOS transistor MP15 and NMOS transistor MN15 which have commonly-connected sources and commonly-connected drains. The commonly-connected sources (or the commonly-connected drains) of the PMOS transistor MP15 and NMOS transistor MN15 are connected to the input terminal 11, and the commonly-connected drains (or the commonly-connected sources) are connected to the gate of the NMOS transistor MN11. The gate of the PMOS transistor MP15 is fixed to the circuit-ground level $V_{SS}$ and the gate of the NMOS transistor MN15 is fixed to the power supply level $V_{DD1}$.

In the circuit configuration illustrated in FIG. 7, as in the circuit configuration illustrated in FIG. 6, the transfer gates 15 and 16 are used as the switch elements SW1 and SW2 of the inverter circuit 10 illustrated in FIG. 4. Additionally, the inverter IV1 is provided to operate the transfer gates 15 and 16. The inverter IV1 has an input connected to the output terminal 12 and outputs a signal complementary to the output signal $V_{OUT2}$ output from the output terminal 12.

The transfer gate 15 includes a PMOS transistor MP12 and NMOS transistor MN12 which have commonly-connected sources and commonly-connected drains. The commonly-connected sources (or the commonly-connected drains) of the PMOS transistor MP12 and NMOS transistor MN12 are connected to the input terminal 11, and the commonly-connected drains (or the commonly connected sources) are connected to the gate of the PMOS transistor MP11. The gate of the PMOS transistor MP12 is connected to the output of the inverter IV1 and the gate of the NMOS transistor MN12 is connected to the output terminal 12.

Similarly, the transfer gate 16 includes a PMOS transistor MP13 and NMOS transistor MN13 which have commonly-connected sources and commonly-connected drains. The commonly-connected sources (or the commonly-connected drains) of the PMOS transistor MP13 and NMOS transistor MN13 are connected to the input terminal 11, and the commonly-connected drains (or the commonly connected sources) are connected to the gate of the NMOS transistor MN11. The gate of the PMOS transistor MP13 is connected to the output terminal 12 and the gate of the NMOS transistor MN13 is connected to the output of the inverter IV1.

It would be easily understood to a person skilled in the art that the circuit configuration illustrated in FIG. 7 can achieve the operation illustrated in FIG. 4.

The inverter circuits (10, 10A to 10C) according to the above-described embodiments may be used in various circuits integrated in semiconductor integrated circuits. The inverter circuits according to the above-described embodiments are especially preferable for use as an output stage requiring a large drive capacity, but not requiring a high speed operation. Described in the following are preferred applications of the inverter circuits according to the above-described embodiments. Although applications in which an inverter circuit(s) 10A illustrated in FIG. 5 is used are described in the following, a person skilled in the art would appreciate that the inverter circuits 10, 10B and 10C illustrated in FIGS. 3, 6 and 7 may be used in place of the inverter circuit 10A.

Figure 8:
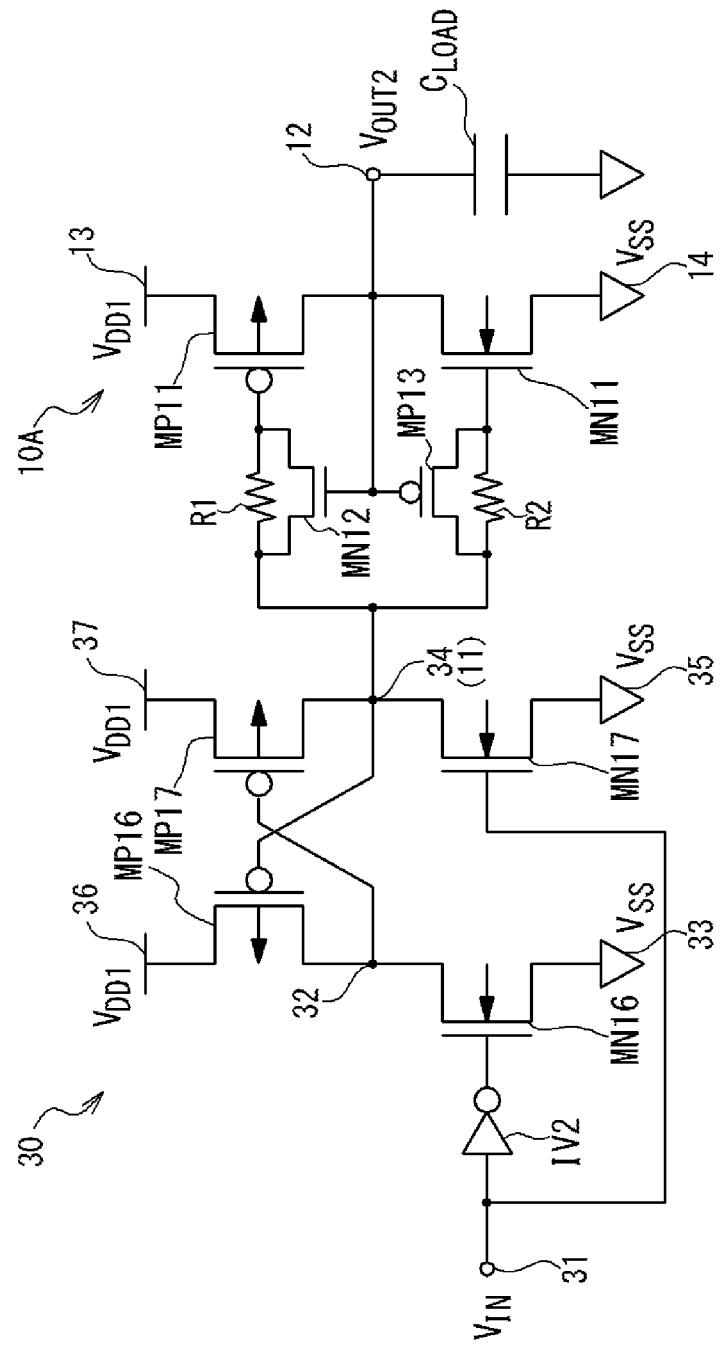
FIG. 8 is a circuit diagram illustrating an exemplary application of the inverter circuit of this embodiment.

FIG. 8 is a circuit diagram illustrating an exemplary configuration of a level shifter 30 incorporating an inverter circuit 10A according to this embodiment. In the level shifter 30 illustrated in FIG. 8, the inverter circuit 10A is used as an output stage.

More specifically, the level shifter 30 includes an inverter IV2, NMOS transistors MN16 and MN17, PMOS transistors MP16 and MP17 in addition to the inverter circuit 10A configured as illustrated in FIG. 5. In the following, a detailed description is given of the configuration of the level shifter 30.

The input terminal 31 of the level shifter 30 is connected to the gate of the NMOS transistor MN17 and also connected to the gate of the NMOS transistor MN16 through the inverter IV2. The NMOS transistor MN16 has a drain connected to a node 32 and a source connected to a negative-side terminal 33. The NMOS transistor MN17 has a drain connected to a node 34 and a source connected to a negative-side terminal 35. The PMOS transistor MP16 has a drain connected to the node 32, a source connected to a positive-side terminal 36 and a gate connected to the node 34. The PMOS transistor MP17 has a drain connected to the node 34, a source connected to a positive-side terminal 37 and a gate connected to the node 32. The positive-side terminals 36 and 37 are both fixed to the power supply level $V_{DD1}$. The node 34 is connected to the input terminal 11 of the inverter circuit 10A.

The level shifter 30 thus configured performs level shifting on the input signal $V_{IN}$ supplied to the input terminal 31 to generate an output signal $V_{OUT}$. When receiving as the input signal $V_{IN}$ such a signal that the high level thereof is $V_{DD2}$ ($<V_{DD1}$) and the low level is $V_{SS}$, the level shifter 30 generates the output signal $V_{OUT}$ in response to the input signal $V_{IN}$ so that the high level of the output signal $V_{OUT}$ is $V_{DD1}$ and the low level is the circuit-ground level $V_{SS}$.

Figure 9:
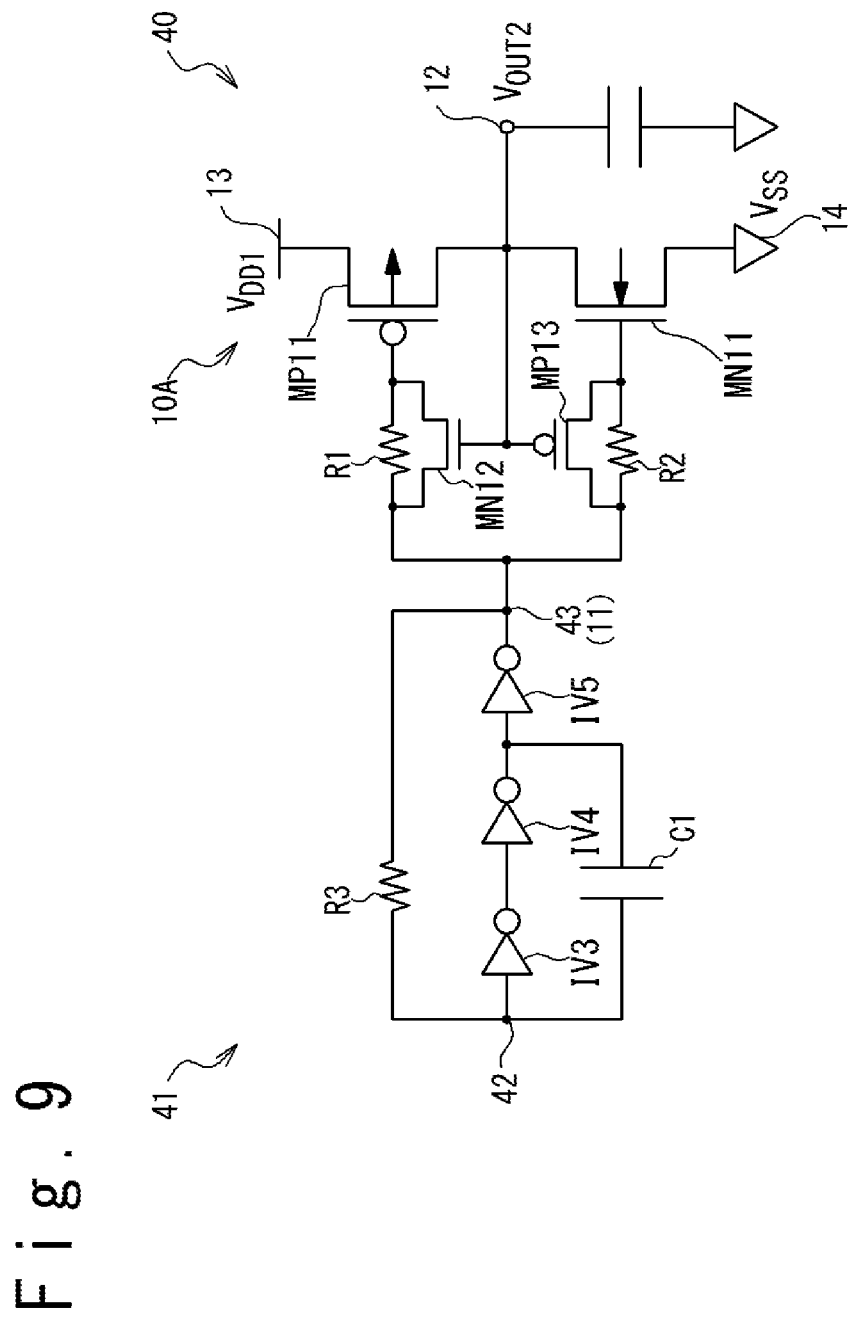
FIG. 9 is a circuit diagram illustrating another exemplary application of the inverter circuit of this embodiment.

FIG. 9 is a circuit diagram illustrating an exemplary configuration of an oscillation circuit 40 incorporating an inverter circuit 10A according to this embodiment. The inverter circuit 10A is used as an output stage also in the oscillation circuit 40 illustrated in FIG. 9.

The oscillation circuit 40 includes an oscillator 41 in addition to the inverter circuit 10A. The oscillator 41, which is configured to generate a periodic signal through oscillation, includes inverters IV3 to IV5, a resistor element R3 and a capacitor element C1. The inverters IV3 to IV5 are serially connected between nodes 42 and 43. The resistor element R3 is connected in parallel with the inverters IV3 to IV5 between the nodes 42 and 43. The capacitor element C1 is connected between the node 42 and the output of the inverter IV4 (that is, the input of the inverter IV5). The oscillator 41 thus constructed generates a periodic rectangular signal.

The input terminal 11 of the inverter circuit 10A is connected to the node 43 and the inverter circuit 10A outputs the output signal $V_{OUT2}$ so that the output signal $V_{OUT2}$ has a waveform corresponding to that of the periodic signal generated by the oscillator 41. The configuration illustrated in FIG. 9 allows outputting a rectangular periodic signal from the output terminal 12 as the output signal $V_{OUT2}$. The drive capacity of driving the output terminal 12 is adjustable by the drive capacities (more specifically, the gate widths) of the PMOS transistor MP11 and MN11 of the inverter circuit 10A.

Figure 10:
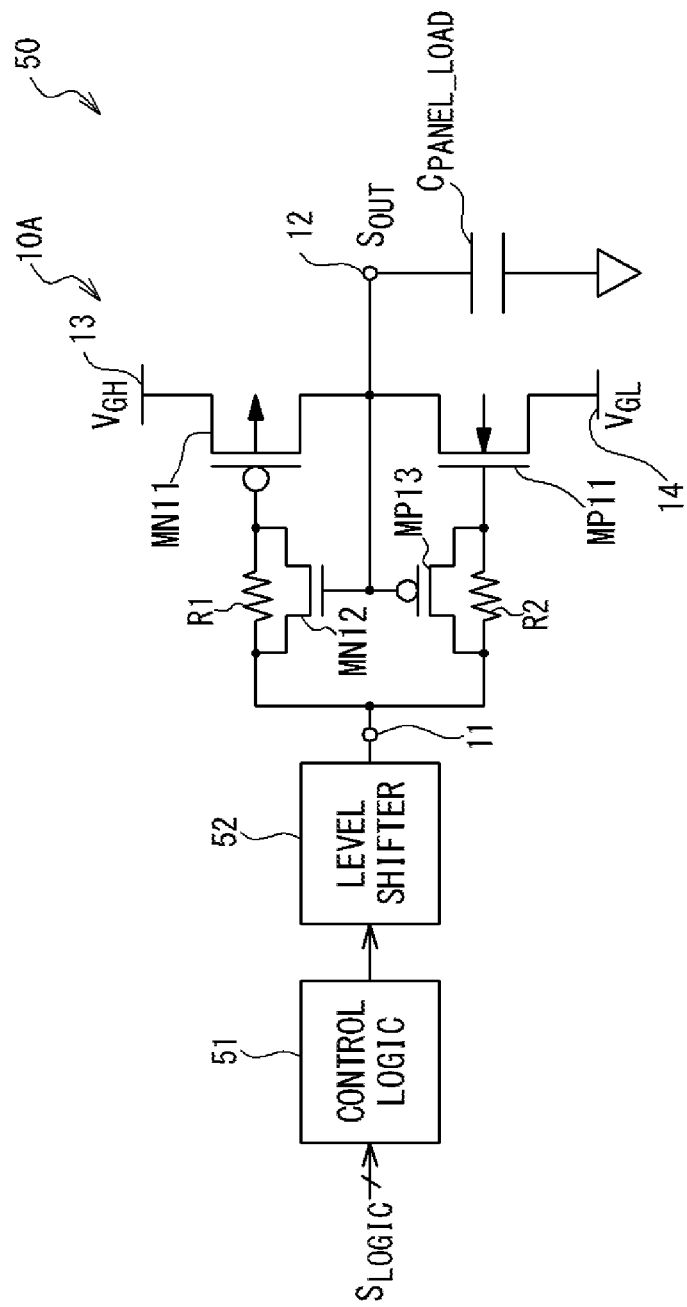
FIG. 10 is a circuit diagram illustrating still another exemplary application of the inverter circuit of this embodiment.

FIG. 10 is a circuit diagram illustrating an exemplary configuration of an external output circuit 50 incorporating an inverter circuit 10A according to this embodiment. The external output circuit 50 illustrated in FIG. 10 is configured to output a signal to an external device provided outside of the semiconductor integrated circuit chip in which the external output circuit 50 is integrated. The external output circuit 50 may be applied to a control output circuit configured to supply a control signal $S_{OUT}$ to a GIP (gate-in-panel) circuit integrated on a liquid crystal display panel; such a control output circuit is often referred to as a panel interface circuit. It should be noted that the GIP circuit drives the gate lines of the liquid crystal display panel and integrated on the glass substrate of the liquid crystal display panel through an SOG (system on glass) technique. Also in the external output circuit 50 illustrated in FIG. 10, the inverter circuit 10A is used as an output stage.

The external output circuit 50 includes a control logic 51 and a level shifter 52 in addition to the inverter circuit 10A. The control logic 51 outputs a logical signal of the same logical value as the control signal $S_{OUT}$, in response to externally-supplied control signals $S_{LOGIC}$. The level shifter 52 performs level shifting on the logical signal received from the control logic 51. In the configuration illustrated in FIG. 10, the level shifter 52 outputs a logical signal of the logical value complementary to that of the logical signal received from the control logic 51. The output of the level shifter 52 is used as the input terminal 11 of the inverter circuit 10A.

In the configuration illustrated in FIG. 10, the positive-side terminal 13 of the inverter circuit 10A is fixed to the potential $V_{GH}$ which is the high level of the gate lines, and the negative-side terminal 14 is fixed to the potential $V_{GL}$ which is the low level of the gate lines. This configuration allows supplying the control signal $S_{OUT}$ to the GIP circuit so that the high level of the control signal $S_{OUT}$ is the potential $V_{GH}$ and the low level of the same is the potential $V_{GL}$.

Figure 11:
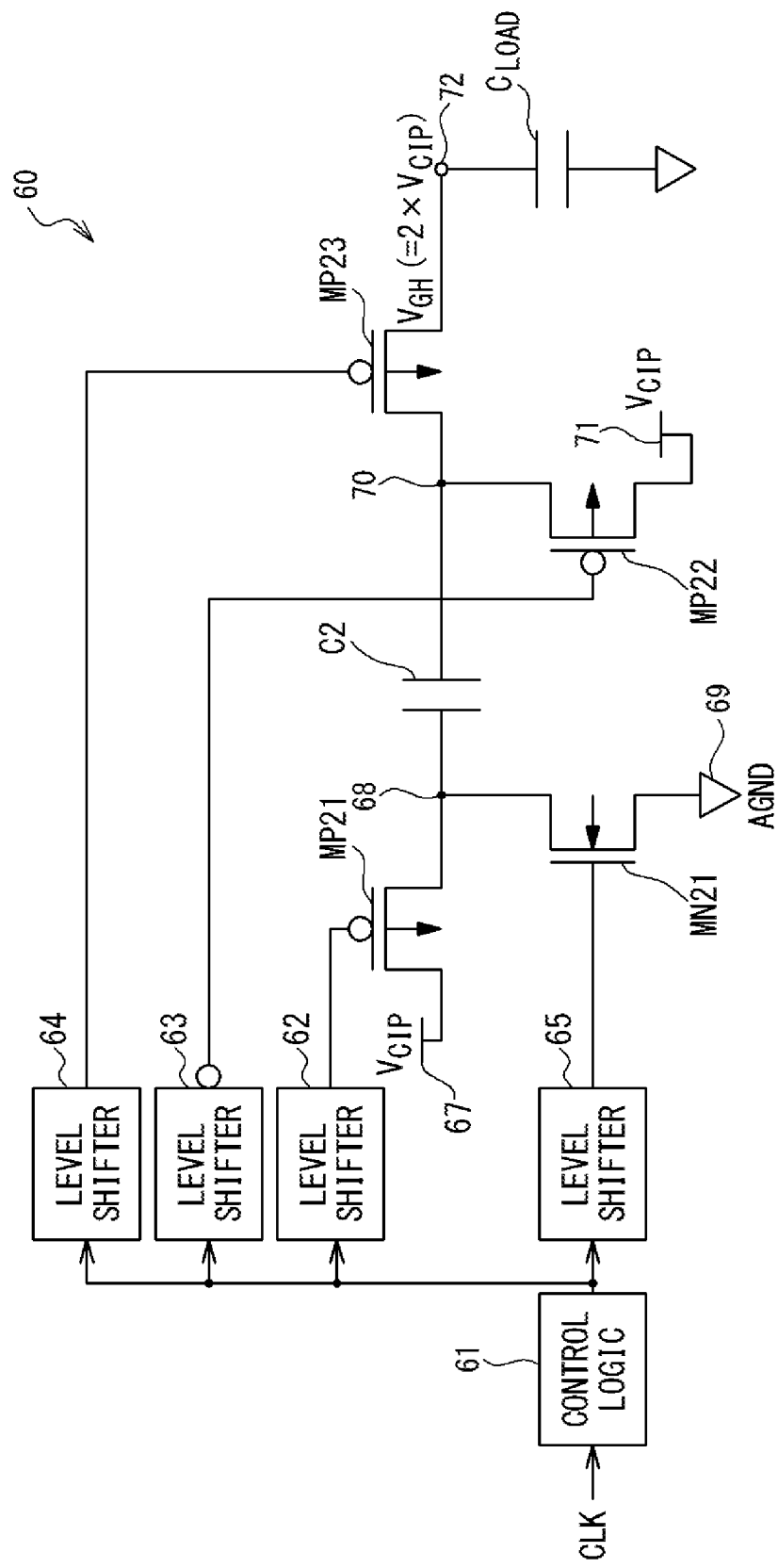
FIG. 11 is a circuit diagram illustrating still another exemplary application of the inverter circuit of this embodiment.

FIG. 11 is a circuit diagram illustrating an exemplary configuration of a charge pump circuit 60 using level shifters each incorporating an inverter circuit 10A according to this embodiment. The charge pump circuit 60 includes a control logic 61, level shifters 62 to 65, PMOS transistors MP21 to MP23, an NMOS transistor MN21 and a capacitor C2.

The control logic 61 outputs a control signal controlling the turn-on-and-off of the PMOS transistors MP21 to MP23 and the NMOS transistor MN21, in response to an externally-supplied clock signal CLK.

The level shifters 62 to 64 respectively perform level shifting on the control signal received from the control logic 61 to generate gate drive signals driving the gates of the PMOS transistors MP21 to MP23, respectively. The level shifters 62 and 64 generate the gate drive signals of the same logical value as that of the control signal received from the control logic 61 and the level shifter 63 generates a gate drive signal of the logical value complementary to that of the control signal received from the control logic 61.

The level shifter 65 performs level shifting on the control signal received from the control logic 61 to generate a gate drive signal driving the gate of the NMOS transistor MN21. The level shifter 65 generates the gate control signal so that the logical value of the generated gate control signal is the same as that of the control signal received from the control logic 61.

In this embodiment, the level shifter configured as illustrated in FIG. 8 is used as the level shifters 62 to 65 in the configuration illustrated in FIG. 11. It should be noted however that the level shifter 62, which generates the gate drive signal of the logical value complementary to that of the control signal received from the control logic 61, is modified so that the input terminal 11 of the inverter circuit 10A is connected to the node 32 in place of the node 34.

The PMOS transistor MP21 has a source connected to a positive-side terminal 67 and a drain connected to a node 68. In this embodiment, the positive-side terminal 67 is fixed to a power supply level $V_{CIP}$ generated by a stabilized power supply. The NMOS transistor MN21 has a drain connected to the node 68 and a source connected to a negative-side terminal 69. In this embodiment, the negative-side terminal 69 is fixed to a circuit-ground level AGND of an analog circuit.

The capacitor C2 is connected between the node 68 and a node 70. The capacitor C2 is used for boosting operation.

The PMOS transistor MP22 has a source connected to a positive-side terminal 71 and a drain connected to the node 70. In this embodiment, the positive-side terminal 71 is fixed to the power supply level $V_{CIP}$. As described above, the power supply level $V_{CIP}$ is generated by the stabilized power supply.

The PMOS transistor MP23 has a source connected to the node 70 and a drain connected to an output terminal 72.

When receiving the clock signal CLK, the charge pump circuit 60 illustrated in FIG. 11 performs boosting operation with the capacitor C2 and thereby generates a potential $V_{GH}$ twice as high as the power supply level $V_{CIP}$ on the output terminal 72. In this operation, the PMOS transistors MP21 to MP23 and the NMOS transistor MN21 are used to switch the connection of the capacitor C2.

Embodiments of the present disclosure can be also described as follows:

In one embodiment, an inverter circuit includes: a first P-channel MISFET having a source connected to a positive-side terminal and a drain connected to an output terminal; a first N-channel MISFET having a source connected to a negative-side terminal and a drain connected to the output terminal, the negative-side terminal having a potential lower than that of the positive-side terminal; a first delay element connected between a gate of the first P-channel MISFET and an input terminal to which an input signal is supplied; a first switch element connected in parallel with the first delay element between the input terminal and the gate of the first P-channel MISFET; a second delay element connected between the input terminal and a gate of the first N-channel MISFET; and a second switch element connected in parallel with the second delay circuit between the input terminal and the gate of the first N-channel MISFET. The first and second switch elements operate in response to a potential on the output terminal.

In another embodiment, a level shifter for generating an output signal through level shifting of an input signal is provided. The level shifter includes an output stage configured to output an output signal from an output terminal. The output stage includes an inverter circuit including: a first P-channel MISFET having a source connected to a positive-side terminal and a drain connected to the output terminal; a first N-channel MISFET having a source connected to a negative-side terminal and a drain connected to the output terminal, the negative-side terminal having a potential lower than that of the positive-side terminal; a first delay element connected between a gate of the first P-channel MISFET and an input terminal to which an input signal is supplied; a first switch element connected in parallel with the first delay element between the input terminal and the gate of the first P-channel MISFET; a second delay element connected between the input terminal and a gate of the first N-channel MISFET; and a second switch element connected in parallel with the second delay circuit between the input terminal and the gate of the first N-channel MISFET. The first and second switch elements operate in response to a potential on the output terminal.

In still another embodiment, an oscillation circuit includes: an oscillator configured to generate a periodic signal through oscillation; and an inverter circuit having an input terminal to which the periodic signal is supplied. The inverter circuit includes: a first P-channel MISFET having a source connected to a positive-side terminal and a drain connected to an output terminal; a first N-channel MISFET having a source connected to a negative-side terminal and a drain connected to the output terminal, the negative-side terminal having a potential lower than that of the positive-side terminal; a first delay element connected between a gate of the first P-channel MISFET and the input terminal; a first switch element connected in parallel with the first delay element between the input terminal and the gate of the first P-channel MISFET; a second delay element connected between the input terminal and a gate of the first N-channel MISFET; and a second switch element connected in parallel with the second delay circuit between the input terminal and the gate of the first N-channel MISFET. The first and second switch elements operate in response to a potential on the output terminal.

In still another embodiment, a semiconductor integrated circuit includes: an external output circuit including an inverter outputting an external output signal from an output terminal to an external entity provided outside of the semiconductor integrated circuit. The inverter circuit includes: a first P-channel MISFET having a source connected to a positive-side terminal and a drain connected to the output terminal; a first N-channel MISFET having a source connected to a negative-side terminal and a drain connected to the output terminal, the negative-side terminal having a potential lower than that of the positive-side terminal; a first delay element connected between a gate of the first P-channel MISFET and the input terminal; a first switch element connected in parallel with the first delay element between the input terminal and the gate of the first P-channel MISFET; a second delay element connected between the input terminal and a gate of the first N-channel MISFET; and a second switch element connected in parallel with the second delay circuit between the input terminal and the gate of the first N-channel MISFET. The first and second switch elements operate in response to a potential on the output terminal.

In still another embodiment, a charge pump circuit includes: a capacitor; a MOS transistor switching a connection of the capacitor; and a level shifter generates an output signal through level shifting of a control signal and supplies the output signal from an output terminal to a gate of the MOS transistor. The level shifter includes: an output stage configured to output the output signal from the output terminal. The output stage includes an inverter circuit including: a first P-channel MISFET having a source connected to a positive-side terminal and a drain connected to the output terminal; a first N-channel MISFET having a source connected to a negative-side terminal and a drain connected to the output terminal, the negative-side terminal having a potential lower than that of the positive-side terminal; a first delay element connected between a gate of the first P-channel MISFET and an input terminal to which an input signal is supplied; a first switch element connected in parallel with the first delay element between the input terminal and the gate of the first P-channel MISFET; a second delay element connected between the input terminal and a gate of the first N-channel MISFET; and a second switch element connected in parallel with the second delay circuit between the input terminal and the gate of the first N-channel MISFET. The first and second switch elements operate in response to a potential on the output terminal.

Although various embodiments have been specifically described in the above, the present invention must not be construed as being limited to the above-described embodiments and practical examples. It would be apparent to a person skilled in the art that the present invention may be practiced with various modifications.

What is claimed is:

1. An inverter circuit, comprising:
   a first P-channel metal insulator semiconductor field effect transistor (MISFET) having a source connected to a positive-side terminal and a drain connected to an output terminal;
   a first N-channel MISFET having a source connected to a negative-side terminal and a drain connected to the output terminal, the negative-side terminal having a potential lower than that of the positive-side terminal;
   a first delay element connected between a gate of the first P-channel MISFET and an input terminal to which an input signal is supplied;
   a first switch element connected in parallel with the first delay element between the input terminal and the gate of the first P-channel MISFET;
   a second delay element connected between the input terminal and a gate of the first N-channel MISFET,
   a second switch element connected in parallel with the second delay element between the input terminal and the gate of the first N-channel MISFET,
   wherein the first switch element comprises a first transfer gate having an inverting gate input and the second switch element comprises a second transfer gate having a non-inverting gate input;
   an inverter connected between the output terminal and each of the inverting gate input and the non-inverting gate input; and
   wherein the first and second switch elements operate in response to a potential on the output terminal.

2. The inverter circuit according to claim 1, wherein the first switch element is turned off when the output terminal is set to a first potential and turned on when the output terminal is set to a second potential higher than the first potential, and
   wherein the second switch element is turned on when the output terminal is set to the first potential, and turned off when the output terminal is set to the second potential.

3. The inverter circuit according to claim 1, wherein the first switch element includes a second N-channel MISFET associated with the first transfer gate,
   wherein the second switch element includes a second P-channel MISFET associated with the second transfer gate,
   wherein one of a source and a drain of the second N-channel MISFET is connected to the input terminal and the other of the source and the drain is connected to the gate of the first P-channel MISFET, wherein one of a source and a drain of the second P-channel MISFET is connected to the input terminal and the other of the source and the drain is connected to the gate of the first N-channel MISFET, and wherein gates of the second N-channel MISFET and the second P-channel MISFET are connected to the output terminal.

4. The inverter circuit according to claim 3, wherein the first switch element further includes a third P-channel MISFET associated with the first transfer gate, one of a source and drain of the third P-channel MISFET being connected to the input terminal and the other being connected to the gate of the first P-channel MISFET, wherein the second switch element further includes a third N-channel MISFET associated with the second transfer gate, one of a source and drain of the third N-channel MISFET being connected to the input terminal and the other being connected to the gate of the first N-channel MISFET, wherein the inverter has an output connected to gates of the third P-channel MISFET and the third N-channel MISFET.

5. The inverter circuit according to claim 1, wherein each of the first and second delay elements includes a resistor element.

6. The inverter circuit according to claim 5, wherein resistance values of the respective resistor elements are selected according to the following:

$$0.8 \leq \frac{R_{R1} \cdot C_{GP11}}{R_{R2} \cdot C_{GN11}} \leq 1.2,$$

where $R_{R1}$ represents a resistance of the first delay element, $R_{R2}$ represents a resistance of the second delay element, $C_{GP11}$ represents a gate capacitance of the first P-channel MISFET, and $C_{GN11}$ represents a gate capacitance of the first N-channel MISFET.

7. The inverter circuit according to claim 6, wherein the resistance values of the respective resistor elements are selected according to the following:

$$0.9 \leq \frac{R_{R1} \cdot C_{GP11}}{R_{R2} \cdot C_{GN11}} \leq 1.1.$$

8. The inverter circuit according to claim 1, wherein each transfer gate respectively comprises:
a second P-channel MISFET having a gate connected with a first fixed potential; and
a second N-channel MISFET having a gate connected with a second fixed potential,
wherein the second P-channel MISFET and the second N-channel MISFET have commonly-connected sources and commonly-connected drains.

9. The inverter circuit according to claim 8, wherein the first fixed potential comprises a circuit-ground level, and wherein the second fixed potential comprises a power supply level.

10. An inverter circuit, comprising:
a first P-channel metal insulator semiconductor field effect transistor (MISFET) having a source connected to a positive-side terminal and a drain connected to an output terminal;
a first N-channel MISFET having a source connected to a negative-side terminal and a drain connected to the output terminal, the negative-side terminal having a potential lower than that of the positive-side terminal;
a first resistor element connected between an input terminal to which an input signal is supplied and a gate of the first P-channel MISFET;
a second resistor element connected between the input terminal and a gate of the first N-channel MISFET;
a first transfer gate having an inverting gate input and comprising a second N-channel MISFET connected in parallel with the first resistor element;
a second transfer gate having a non-inverting gate input and comprising a second P-channel MISFET connected in parallel with the second resistor element,
wherein one of a source and drain of the second N-channel MISFET is connected to the input terminal and the other is connected to the gate of the first P-channel MISFET,
wherein one of a source and drain of the second P-channel MISFET is connected to the input terminal and the other is connected to the gate of the first N-channel MISFET, and
wherein the gates of the second N-channel MISFET and the second P-channel MISFET are connected to the output terminal; and
an inverter connected between the output terminal and each of the inverting gate input and the non-inverting gate input.

11. A semiconductor integrated circuit, comprising:
a level shifter configured to generate an output signal through level shifting of an input signal,
wherein the level shifter includes:
an output stage configured to output an output signal from an output terminal,
wherein the output stage includes an inverter circuit comprising:
a first P-channel metal insulator semiconductor field effect transistor (MISFET) having a source connected to a positive-side terminal and a drain connected to the output terminal;
a first N-channel MISFET having a source connected to a negative-side terminal and a drain connected to the output terminal, the negative-side terminal having a potential lower than that of the positive-side terminal;
a first delay element connected between a gate of the first P-channel MISFET and an input terminal to which an input signal is supplied;
a first switch element connected in parallel with the first delay element between the input terminal and the gate of the first P-channel MISFET;
a second delay element connected between the input terminal and a gate of the first N-channel MISFET;
a second switch element connected in parallel with the second delay element between the input terminal and the gate of the first N-channel MISFET,
wherein each of the first and second delay-switch elements includes a respective transfer gate, wherein each transfer gate comprises a gate input, and
wherein the first and second switch elements operate in response to a potential on the output terminal; and
an inverter connected between the output terminal and the gate input of each transfer gate.

12. The semiconductor integrated circuit according to claim 11, further comprising:
a capacitor configured for a boosting operation in a charge pump circuit;

a MOS transistor configured to switch a connection of the capacitor in the charge pump circuit; and
a second level shifter configured to generate a second output signal through level shifting of a control signal, and to supply the second output signal from a second output terminal to a gate of the MOS transistor,
wherein the second level shifter includes:
a second output stage configured to output the second output signal from the second output terminal,
wherein the second output stage includes a second inverter circuit comprising:
a second P-channel MISFET having a source connected to a positive-side terminal and a drain connected to the second output terminal;
a second N-channel MISFET having a source connected to a negative-side terminal and a drain connected to the output terminal, the negative-side terminal having a potential lower than that of the positive-side terminal;
a third delay element connected between a gate of the second P-channel MISFET and a second input terminal to which a second input signal is supplied;
a third switch element connected in parallel with the third delay element between the second input terminal and the gate of the second P-channel MISFET;
a fourth delay element connected between the second input terminal and a gate of the second N-channel MISFET; and
a fourth switch element connected in parallel with the fourth delay element between the second input terminal and the gate of the second N-channel MISFET,
wherein the third and fourth switch elements operate in response to a potential on the second output terminal.

13. The semiconductor integrated circuit according to claim 11, wherein the first switch element is turned off when the output terminal is set to a first potential and turned on when the output terminal is set to a second potential higher than the first potential, and
wherein the second switch element is turned on when the output terminal is set to the first potential, and turned off when the output terminal is set to the second potential.

14. The semiconductor integrated circuit according to claim 11, wherein the first switch element includes a second N-channel MISFET associated with the transfer gate of the first switch element,
wherein the second switch element includes a second P-channel MISFET associated with the transfer gate of the second switch element,
wherein one of a source and a drain of the second N-channel MISFET is connected to the input terminal and the other of the source and the drain is connected to the gate of the first P-channel MISFET,
wherein one of a source and a drain of the second P-channel MISFET is connected to the input terminal and the other of the source and the drain is connected to the gate of the first N-channel MISFET, and
wherein gates of the second N-channel MISFET and the second P-channel MISFET are connected to the output terminal.

15. The semiconductor integrated circuit according to claim 14,
wherein the first switch element further includes a third P-channel MISFET associated with the transfer gate of the first switch element, one of a source and drain of the third P-channel MISFET being connected to the input terminal and the other being connected to the gate of the first P-channel MISFET,
wherein the second switch element further includes a third N-channel MISFET associated with the transfer gate of the second switch element, one of a source and drain of the third N-channel MISFET being connected to the input terminal and the other being connected to the gate of the first N-channel MISFET,
wherein the inverter has an output connected to gates of the third P-channel MISFET and the third N-channel MISFET.

16. The semiconductor integrated circuit according to claim 11, wherein each of the first and second delay elements includes a resistor element.

17. The semiconductor integrated circuit according to claim 16, wherein resistance values of the respective resistor elements are selected according to the following:

$$0.8 \leq \frac{R_{R1} \cdot C_{GP11}}{R_{R2} \cdot C_{GN11}} \leq 1.2,$$

where $R_{R1}$ represents a resistance of the first delay element, $R_{R2}$ represents a resistance of the second delay element, $C_{GP11}$ represents a gate capacitance of the first P-channel MISFET, and $C_{GN11}$ represents a gate capacitance of the first N-channel MISFET.

18. The semiconductor integrated circuit according to claim 17, wherein the resistance values of the respective resistor elements are selected according to the following:

$$0.9 \leq \frac{R_{R1} \cdot C_{GP11}}{R_{R2} \cdot C_{GN11}} \leq 1.1.$$

19. The semiconductor integrated circuit according to claim 11, wherein each of the first and second delay elements includes a respective transfer gate, wherein each transfer gate respectively comprises:
a second P-channel MISFET having a gate connected with a first fixed potential; and
a second N-channel MISFET having a gate connected with a second fixed potential,
wherein the second P-channel MISFET and the second N-channel MISFET have commonly-connected sources and commonly-connected drains.

20. The semiconductor integrated circuit according to claim 19, wherein the first fixed potential comprises a circuit-ground level, and wherein the second fixed potential comprises a power supply level.

* * * * *

UNITED STATES PATENT AND TRADEMARK OFFICE
CERTIFICATE OF CORRECTION

| | | |
|---|---|---|
| PATENT NO. | : 10,270,363 B2 | Page 1 of 1 |
| APPLICATION NO. | : 15/380744 | |
| DATED | : April 23, 2019 | |
| INVENTOR(S) | : Naoji Shimizu | |

It is certified that error appears in the above-identified patent and that said Letters Patent is hereby corrected as shown below:

In the Specification

In Column 6, Line 34, delete "$C_{LOAD}As$" and insert -- $C_{LOAD}$ As --, therefor.

In the Claims

In Column 16, Line 57, in Claim 11, delete "delay-switch" and insert -- switch --, therefor.

Signed and Sealed this
Twenty-first Day of April, 2020

Andrei Iancu
*Director of the United States Patent and Trademark Office*